United States Patent
Matsushima

(10) Patent No.: US 7,763,964 B2
(45) Date of Patent: Jul. 27, 2010

(54) SEMICONDUCTOR DEVICE AND SEMICONDUCTOR MODULE USING THE SAME

(75) Inventor: Ryoji Matsushima, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 116 days.

(21) Appl. No.: 12/032,104

(22) Filed: Feb. 15, 2008

(65) Prior Publication Data

US 2008/0197472 A1    Aug. 21, 2008

(30) Foreign Application Priority Data

Feb. 20, 2007    (JP) .................. 2007-038862

(51) Int. Cl.
*H01L 23/02*    (2006.01)
*H01L 23/48*    (2006.01)
*H01L 23/52*    (2006.01)
*H01L 29/40*    (2006.01)

(52) U.S. Cl. .............. 257/686; 257/777; 257/784

(58) Field of Classification Search ........ 257/686, 257/723, 777, 784
See application file for complete search history.

(56) References Cited

U.S. PATENT DOCUMENTS

| | | | | |
|---|---|---|---|---|
| 5,495,398 A * | 2/1996 | Takiar et al. | ............... | 361/790 |
| 5,545,922 A * | 8/1996 | Golwalkar et al. | ........... | 257/676 |
| 5,615,475 A * | 4/1997 | Burns | ........................... | 29/827 |
| 5,798,564 A * | 8/1998 | Eng et al. | ................... | 257/686 |
| 5,815,372 A * | 9/1998 | Gallas | ........................ | 361/760 |
| 5,998,864 A * | 12/1999 | Khandros et al. | ........... | 257/723 |
| 6,177,721 B1 * | 1/2001 | Suh et al. | ..................... | 257/686 |
| 6,218,731 B1 * | 4/2001 | Huang et al. | ................. | 257/738 |
| 6,291,892 B1 * | 9/2001 | Yamaguchi | ................. | 257/778 |
| 6,307,257 B1 * | 10/2001 | Huang et al. | ................. | 257/676 |
| 6,333,566 B1 * | 12/2001 | Nakamura | ................... | 257/790 |
| 6,376,904 B1 * | 4/2002 | Haba et al. | ................... | 257/686 |
| 6,380,615 B1 | 4/2002 | Park et al. | | |
| 6,388,333 B1 * | 5/2002 | Taniguchi et al. | ........... | 257/777 |
| 6,414,385 B1 * | 7/2002 | Huang et al. | ................. | 257/690 |
| 6,420,783 B2 | 7/2002 | Wada et al. | | |
| 6,433,421 B2 * | 8/2002 | Masuda et al. | .............. | 257/723 |
| 6,445,594 B1 * | 9/2002 | Nakagawa et al. | .......... | 361/776 |
| 6,472,736 B1 * | 10/2002 | Yeh et al. | .................... | 257/686 |
| 6,476,474 B1 * | 11/2002 | Hung | ......................... | 257/686 |
| 6,555,919 B1 * | 4/2003 | Tsai et al. | ................... | 257/777 |

(Continued)

FOREIGN PATENT DOCUMENTS

JP      2001-36000      2/2001

*Primary Examiner*—Leonardo Andújar
*Assistant Examiner*—Teresa M Arroyo
(74) *Attorney, Agent, or Firm*—Oblon, Spivak, McClelland, Maier & Neustadt, L.L.P.

(57) ABSTRACT

A semiconductor device includes a circuit board which has a first main surface having first connection pads, a second main surface having second connection pads, a first opening passing through a vicinity of the first connection pads, and a second opening passing through a vicinity of the second connection pads. A first semiconductor element is mounted in a face-down state on the first main surface of the circuit board. First electrode pads are exposed into the second opening and connected to the second connection pads through the second opening. A second semiconductor element is mounted in a face-up state on the second main surface of the circuit board. Second electrode pads are exposed into the first opening and connected to the first connection pads through the first opening.

20 Claims, 9 Drawing Sheets

U.S. PATENT DOCUMENTS

| | | | |
|---|---|---|---|
| 6,590,279 B1 * | 7/2003 | Huang et al. ................. 257/676 |
| 6,750,080 B2 | 6/2004 | Masuda et al. |
| 7,166,918 B2 * | 1/2007 | Quinlan et al. .............. 257/724 |
| 7,215,008 B2 | 5/2007 | Kim et al. |
| 2003/0197260 A1 * | 10/2003 | Nishimura et al. .......... 257/686 |
| 2005/0133897 A1 * | 6/2005 | Baek et al. ................... 257/686 |
| 2006/0033219 A1 * | 2/2006 | Kalidas et al. .............. 257/784 |
| 2007/0023922 A1 * | 2/2007 | Okane et al. ................. 257/778 |
| 2007/0096284 A1 * | 5/2007 | Wallace ....................... 257/686 |
| 2007/0102801 A1 * | 5/2007 | Ishida et al. ................. 257/686 |

* cited by examiner

SEMICONDUCTOR DEVICE AND SEMICONDUCTOR MODULE USING THE SAME

CROSS-REFERENCE TO RELATED APPLICATIONS

This application is based upon and claims the benefit of priority from the prior Japanese Patent Application No. 2007-038862 filed on Feb. 20, 2007; the entire contents of which are incorporated herein by reference.

BACKGROUND OF THE INVENTION

1. Field of the Invention

The present invention relates to a semiconductor device and a semiconductor module using the same.

2. Description of the Related Art

To realize miniaturization and high-density packaging of the semiconductor device, a stacked multichip package having plural semiconductor elements stacked and sealed in one package has already been put into practical use. In the stacked multichip package, the plural semiconductor elements are sequentially stacked on a circuit substrate such as a circuit board or a lead frame having external connection terminals. In a case where the plural semiconductor elements and the circuit substrate are connected by wire bonding, the semiconductor elements are stacked in a face-up state to enable to connect to metal wires.

In a conventional stacked multichip package, the metal wires which are connected to a semiconductor element of an uppermost portion are arranged so as to inevitably pass through the portion which exceeds the stack thickness of the plural semiconductor elements. To seal the plural semiconductor elements having the stacked structure and wiring pattern with a resin, the sealing resin is required to have a thickness which fully covers the wire for the semiconductor element of the uppermost portion. Thus, in the conventional stacked multichip package, the wire form for the semiconductor element of the uppermost portion becomes the factor which increases the thickness of the package.

JP-A 2001-036000 (KOKAI) describes a semiconductor package which has two semiconductor elements arranged with their pad-forming surfaces opposed to each other. An insulating layer is formed on the pad-forming surfaces of the semiconductor elements, and metal wires are formed on the surface of the insulating layer and connected by solder balls. The thickness of the semiconductor package cannot be decreased satisfactorily. Besides, the mounting board and the semiconductor package are connected by disposing bonding wires in the space between the two semiconductor elements. In view of the above, the thickness of the semiconductor package tends to become large.

SUMMARY OF THE INVENTION

A semiconductor device according to an aspect of the present invention includes: a circuit board which is provided with a first main surface having first connection pads, a second main surface, located on an opposite side of the first main surface, having second connection pads, a first opening formed to pass through a vicinity of the first connection pads, and a second opening formed to pass through a vicinity of the second connection pads; a first semiconductor element, mounted on the first main surface of the circuit board, having first electrode pads exposed into the second opening; a second semiconductor element, mounted on the second main surface of the circuit board, having second electrode pads exposed into the first opening; first connection members which are disposed through the first opening to electrically connect the first connection pads and the second electrode pads; second connection members which are disposed through the second opening to electrically connect the second connection pads and the first electrode pads; and a sealing portion which seals the first and second semiconductor elements together with the first and second connection members and a part of the circuit board.

A semiconductor device according to another aspect of the present invention includes: a circuit board which is provided with a first main surface having first connection pads, a second main surface, located on a opposite side of the first main surface, having second connection pads, a first opening formed to pass through a vicinity of the first connection pads, and a second opening formed to pass through a vicinity of the second connection pads; a first element group which includes a plurality of semiconductor elements having electrode pads, the plurality of semiconductor elements being stacked in a stepped shape on the first main surface of the circuit board to expose the electrode pads into the second opening; a second element group which includes a plurality of semiconductor elements having electrode pads, the plurality of semiconductor elements being stacked in a stepped shape on the second main surface of the circuit board to expose the electrode pads into the first opening; first connection members which are disposed through the first opening to electrically connect the first connection pads and the electrode pads of the plurality of semiconductor elements configuring the second element group; second connection member which are disposed through the second opening to electrically connect the second connection pads and the electrode pads of the plurality of semiconductor elements configuring the first element group; and a sealing portion which seals the first and second element groups together with the first and second connection members and a part of the circuit board.

A semiconductor module according to an aspect of the present invention includes a plurality of the semiconductor devices according to the aspect of the present invention, wherein the plurality of the semiconductor devices are stacked.

DETAILED DESCRIPTION OF THE INVENTION

Figure 1:
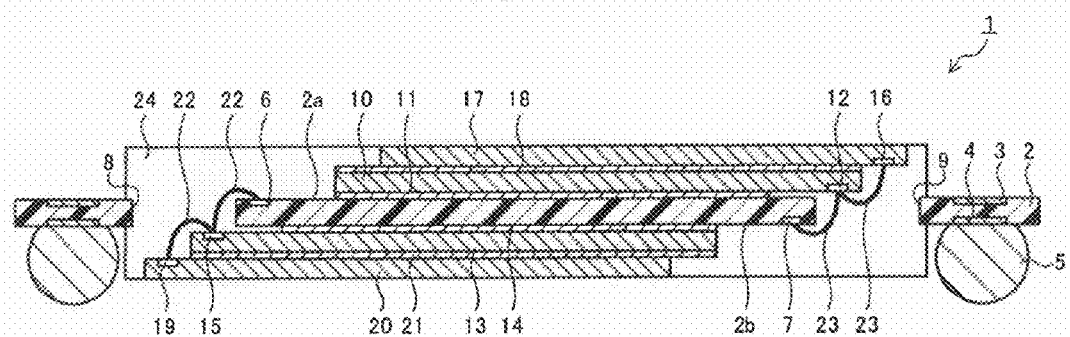
FIG. 1 is a sectional view showing of a semiconductor device according to an embodiment.
Figure 2:
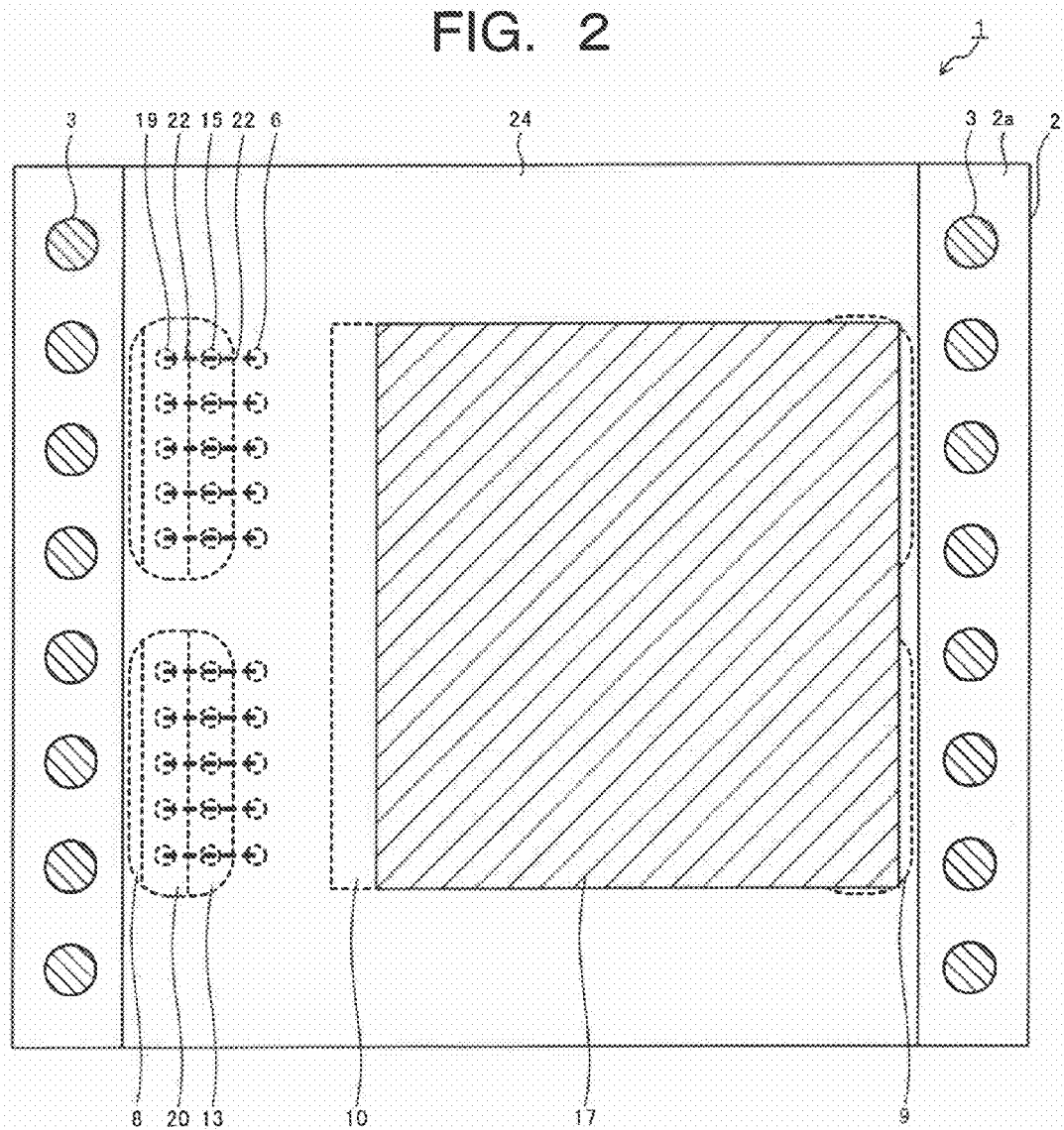
FIG. 2 is a plan view of the semiconductor device shown in FIG. 1.
Figure 3:
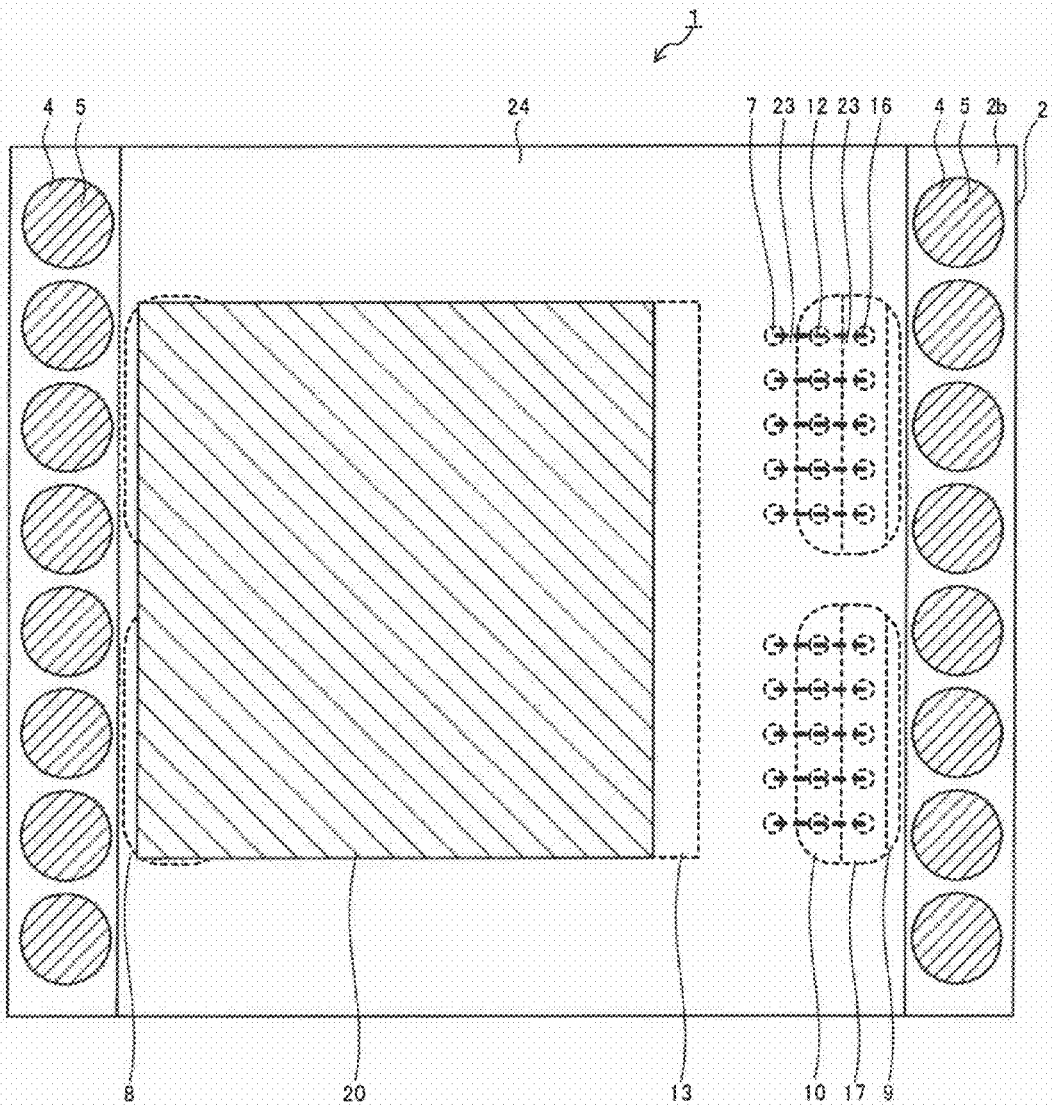
FIG. 3 is a rear view of the semiconductor device shown in FIG. 1.

Modes of conducting the present invention will be described below with reference to the drawings. FIG. 1, FIG. 2 and FIG. 3 are views showing the structures of the semiconductor device according to an embodiment of the present invention. FIG. 1 is a sectional view, FIG. 2 is a plan view and FIG. 3 is a rear view of the semiconductor device. A semiconductor device 1 shown in the drawings has a circuit board 2 that mounting can be made on its both surfaces. The circuit board 2 has wiring networks (not shown) disposed within and on the surface of an insulating substrate such as a resin substrate, a ceramic substrate or a glass substrate, or a semiconductor substrate. A typical example of the circuit board 2 is a printed circuit board using a glass-epoxy resin or a BT resin (Bismaleimide Triazine Resin).

The circuit board 2 has a first main surface (surface A) 2a which becomes a first element-mounting surface and a second main surface (surface B) 2b which becomes a second element-mounting surface on the opposite side of the first main surface 2a. The first main surface 2a has an element mounting area located in its center and vicinity. Similarly, the second main surface 2b has an element mounting area located in its center and vicinity. Thus, the semiconductor elements can be mounted on the front and rear surfaces of the circuit board 2, and the circuit board 2 has the wiring networks which meets the mounting of the semiconductor elements on both surfaces.

Besides, lands 3, 4 for external connection are disposed on the first and second main surfaces 2a, 2b of the circuit board 2. The lands 3, 4 are formed in an outer area excepting the area sealed by a sealing portion to be described later, and are arranged along two opposite sides (outline sides) of the circuit board 2. External connection terminals 5 such as solder bumps and the like are formed on the lands 4 of the second main surface 2b. When the semiconductor device 1 is not stacked in multiple-stage, the lands 3 on the first main surface 2a are not necessarily required.

On the first main surface 2a of the circuit board 2 are formed first connection pads 6 which are at least partly connected electrically to the lands 3, 4 via the wiring networks. The first connection pads 6 are formed between the element mounting area of the first main surface 2a and one side (first outline side) of two opposite outline sides of the circuit board 2. The first connection pads 6 are arranged substantially linearly so as to be parallel to the first outline side. The first connection pads 6 function as connection points at the time of wire bonding to the second semiconductor element and the like as described later.

On the second main surface 2b of the circuit board 2 are formed second connection pads 7 which are at least partly connected electrically to the lands 3, 4 via the wiring networks. The second connection pads 7 are formed between the element mounting area of the second main surface 2b and the other side (second outline side) of the two opposite outline sides of the circuit board 2. The second connection pads 7 are arranged substantially linearly so as to be parallel to the second outline side. The second connection pads 7 function as connection points at the time of wire bonding to the first semiconductor element and the like as described later.

The circuit board 2 has first openings 8 which are formed through a vicinity of the first connection pads 6 and second openings 9 which are formed through a vicinity of the second connection pads 7. The first openings 8 are formed between the first outline side of the circuit board 2 and the forming region of the first connection pads 6 and have a long shape along the arrangement direction of the first connection pads 6. The second openings 9 are formed between the second outline side of the circuit board 2 and the forming region of the second connection pads 7 and have a long shape along the arrangement direction of the second connection pads 7. The openings 8, 9 become connection member arrangement regions for electrical connection of the circuit board 2 and the semiconductor elements as described later.

A first semiconductor element 10 is adhered to the first main surface 2a of the circuit board 2 via a first adhesive layer 11. The first semiconductor element 10 has first electrode pads 12 which are arranged on the same surface as the forming surface of an integrated circuit including transistors. The first electrode pads 12 are arranged substantially linearly along one side of the first semiconductor element 10. In other words, the first semiconductor element 10 has a one-sided pad structure. Besides, the first semiconductor element 10 is mounted on the first main surface 2a of the circuit board 2 in a face-down state such that the electrode-forming surface having the first electrode pads 12 is opposed to the first main surface (top surface) 2a.

The first semiconductor element 10 is arranged such that a side (pad arrangement side) along the forming region of the first electrode pads 12 becomes on the side of the second openings 9. The first semiconductor element 10 is arranged such that the first electrode pads 12 are exposed into the second openings 9. Thus, the electrode pads 12 of the first semiconductor element 10 arranged in a face-down state with respect to the first main surface (top surface) 2a are prevented from being covered with the circuit board 2. The first electrode pads 12 which are exposed into the second openings 9 can be subjected to wire bonding after the electrode-forming surface of the first semiconductor element 10 is opposed to the first main surface (top surface) 2a.

A second semiconductor element 13 is adhered to the second main surface 2b of the circuit board 2 via a second adhesive layer 14. The second semiconductor element 13 has second electrode pads 15 which are arranged on the same surface as the forming surface of an integrated circuit including transistors. The second electrode pads 15 are arranged substantially linearly along one side of the second semiconductor element 13. The second semiconductor element 13 also has a one-sided pad structure in the same manner as the first semiconductor element 10. The second semiconductor element 13 is mounted on the second main surface 2b of the circuit board 2 in a face-up state such that the electrode-forming surface having the second electrode pads 15 is opposed to the second main surface (under surface) 2b.

The second semiconductor element 13 is arranged such that a side (pad arrangement side) along the forming region of the second electrode pads 15 becomes on the side of the first openings 8. The second semiconductor element 13 is arranged such that the second electrode pads 15 are exposed into the first openings 8. Thus, the electrode pads 15 of the second semiconductor element 13 arranged in a face-up state with respect to the second main surface (under surface) 2b are prevented from being covered with the circuit board 2. The second electrode pads 15 which are exposed into the first openings 8 can be subjected to wire bonding after the electrode-forming surface of the second semiconductor element 13 is opposed to the second main surface (under surface) 2b.

Thus, the first semiconductor element 10 and the second semiconductor element 13 are arranged such that their electrode-forming surfaces are mutually opposed via the circuit board 2, and their pad arrangement sides are arranged in an opposite direction (opposite side with respect to a plane direction of the circuit board 2). Besides, the first electrode pads 12 are exposed into the second openings 9, and the second electrode pads 15 are exposed into the first openings 8 on the side opposite to the second openings 9. Accordingly, the electrode pads 12, 15 and the circuit board 2 can be connected without increasing a sealing thickness to a level or more of the thickness of the first and second semiconductor elements 10, 13 which are stacked via the circuit board 2.

Further, a third semiconductor element 17 having third electrode pads 16 of a one side arrangement structure are adhered onto the first semiconductor element 10 via a third adhesive layer 18. The third semiconductor element 17 is stacked on the first semiconductor element 10 in a face-down state such that its electrode-forming surface is opposed to a surface (back surface (top surface in the figure)) on the side opposite to the electrode-forming surface of the first semiconductor element 10. The semiconductor elements 10, 17 are stacked with their directions aligned such that the electrode pads 12, 16 become close to each other. The third semiconductor element 17 is stacked in a stepped shape with its center displaced from that of the first semiconductor element 10 so to expose the third electrode pads 16. The third electrode pads 16 are exposed into the second openings 9 in the same as the first electrode pads 12.

The first semiconductor element 10 and the third semiconductor element 17 configure a first element group which is mounted on the first main surface 2a of the circuit board 2. The number of the semiconductor elements which configure the first element group is not limited to two but may be three or more. The first element group is configured of plural semiconductor elements. But, the number of the semiconductor elements which are mounted on the first main surface 2a of the circuit board 2 may be one. The semiconductor device 1 shown in FIG. 1 may have a structure that only the first semiconductor element 10 is mounted on the first main surface 2a of the circuit board 2.

A fourth semiconductor element 20 having fourth electrode pads 19 of a one side arrangement structure is adhered to the second semiconductor element 13 (its underside when viewed three-dimensionally) via a fourth adhesive layer 21. The fourth semiconductor element 20 is stacked on the second semiconductor element 13 in a face-up state such that its electrode-forming surface is opposed to a surface (back surface (under surface in the figure)) on the side opposite to the electrode-forming surface of the second semiconductor element 13. The semiconductor elements 13, 20 are stacked with their directions aligned such that the electrode pads 15, 19 become close to each other. The fourth semiconductor element 20 is stacked in a stepped shape with its center displaced from that of the second semiconductor element 13 such that the fourth electrode pads 19 are exposed. The fourth electrode pads 19 are exposed into the first openings 8 in the same as the second electrode pads 15.

The second semiconductor element 13 and the fourth semiconductor element 20 configure a second element group which is mounted on the second main surface 2b of the circuit board 2. The number of the semiconductor elements configuring the second element group is not limited to two but may be three or more. The second element group is configured of plural semiconductor elements. But, the number of the semiconductor elements mounted on the second main surface 2b of the circuit board 2 may be one. The semiconductor device 1 shown in FIG. 1 may have a structure that only the second semiconductor element 13 is mounted on the second main surface 2b of the circuit board 2.

The three-stacked structure having the third semiconductor element 17 stacked on the first semiconductor element 10 and the four-stacked structure having the fourth semiconductor element 20 additionally stacked on the second semiconductor element 13 have the same sealing thickness as that of the plural semiconductor elements (the first through third semiconductor elements 10, 13, 17 or the first through fourth semiconductor elements 10, 13, 17, 20) stacked via the circuit board 2. After satisfying such construction, the electrode pads of the plural semiconductor elements and the circuit board 2 can be connected. To the first through fourth semiconductor elements 10, 13, 17, 20 is applied a memory element such as a NAND-type flash memory but not exclusive.

The first openings 8 provide connection spaces between the first connection pads 6, which are formed on the first main surface 2a of the circuit board 2, and the electrode pads 15, 19 of the second and fourth semiconductor elements 13, 20. First connection members are disposed in the first openings 8. The first connection pads 6 and the electrode pads 15 of the second semiconductor element 13 are electrically connected via first metal wires (such as Au wires) 22 which are disposed through the first openings 8. The first openings 8 are used to electrically connect the second electrode pads 15 via the first metal wires 22 to the first connection pads 6 which are disposed on the first main surface 2a on the side opposite to the second main surface 2b where the second semiconductor element 13 is mounted.

The electrode pads 19 of the fourth semiconductor element 20 are also electrically connected to the first connection pads 6 via the first metal wires 22 which are disposed through the first openings 8. When the second electrode pads 15 and the fourth electrode pads 19 have the same electric characteristics and signal characteristics, the fourth electrode pads 19, the second electrode pads 15 and the first connection pads 6 can be connected sequentially via the first metal wires 22. The metal wires 22 may be connected by separately performing the wire bonding process, or a single metal wire 22 may be used to connect sequentially the fourth electrode pad 19, the second electrode pad 15 and the first connection pad 6.

The second openings 9 provide connection spaces for the second connection pads 7, which are formed on the second main surface 2b of the circuit board 2, and the electrode pads 12, 16 of the first and third semiconductor elements 10, 17. Second connection members are disposed in the second openings 9. The second connection pads 7 and the electrode pads 12 of the first semiconductor element 10 are electrically connected via second metal wires (such as Au wires) 23 which are disposed through the second openings 9. The second openings 9 are used to electrically connect the first electrode pads 12 via the second metal wires 23 to the second connection pads 7 which are disposed on the second main surface 2b on the side opposite to the first main surface 2a where the first semiconductor element 10 is mounted.

The electrode pads 16 of the third semiconductor element 17 are also electrically connected to the second connection pads 7 via the second metal wires 23 which are disposed through the second openings 9. When the first electrode pads 12 and the third electrode pads 16 have the same electric characteristics and signal characteristics, the third electrode pads 16, the first electrode pads 12 and the second connection pads 7 can be connected sequentially via the second metal wires 23. The metal wires 23 may be connected by separately performing the wire bonding process, or a single metal wire 23 may be used to connect sequentially the third electrode pad 16, the first electrode pad 12 and the second connection pad 7.

The semiconductor device 1 shown in FIG. 1 and FIG. 2 has the metal wires (bonding wires) 22, 23 as the connection members for electrical connection of the connection pads 6, 7 of the circuit board 2 and the electrode pads 12, 15, 16, 19 of the semiconductor elements 10, 13, 17, 20. The connection members are not limited to the metal wires. The connection members may be a metal wiring layer or the like. In other words, it is also possible to apply a connection structure using the metal wiring layer or the like for the electrical connection of the connection pads 6, 7 and the electrode pads 12, 15, 16, 19, other than the wire bonding.

The first through fourth semiconductor elements 10, 13, 17, 20 are sealed together with the first and second metal wires 22, 23 and a part of the circuit board 2 with a sealing resin 24 such as an epoxy resin or the like. The sealing resin 24 is formed on a region excepting a terminal-forming region of the circuit board 2 so that the lands 3, 4 and the external connection terminals 5 are exposed. Thus, the semiconductor device 1 is configured. On the first main surface 2a of the circuit board 2, the sealing resin 24 is formed such that the back surface of the third semiconductor element 17 is exposed. On the second main surface 2b of the circuit board 2, the sealing resin 24 is formed such that the back surface of the fourth semiconductor element 20 is exposed. The back surfaces of the third and fourth semiconductor elements 13, 20 are not always exposed but may be covered with the sealing resin 24.

As described above, the first and second metal wires 22, 23 are disposed within the openings 8, 9 respectively, so that the thickness of the sealing resin 24 can be made equal to those of the semiconductor elements 10, 13, 17, 20 stacked via the circuit board 2. Therefore, the thickness of the sealing resin 24 can be decreased even when the stacked semiconductor elements 10, 13, 17, 20 and the circuit board 2 are electrically connected by wire bonding or the like. The thickness of the sealing resin 24 can be minimized by exposing the back surfaces (the back surfaces of the semiconductor elements which are located on the uppermost portions among the semiconductor elements configuring the first and second element groups) of the third and fourth semiconductor elements 13, 20.

Since the thickness of the sealing resin 24 is not affected by the wire shape, it can be determined on the basis of a total thickness of the circuit board 2 and the plural semiconductor elements. Therefore, it becomes possible to make the semiconductor device 1 having the plural semiconductor elements 10, 13, 17, 20 small and thin. Even when the back surfaces of the third and fourth semiconductor elements 13, 20 are covered with the sealing resin 24, the thickness of the sealing resin 24 may be determined to be in a range of capable of covering the third and fourth semiconductor elements 13, 20, so that the thickness of the sealing resin 24 can be suppressed from increasing. Thus, the semiconductor device 1 can be made thin.

Figure 4:
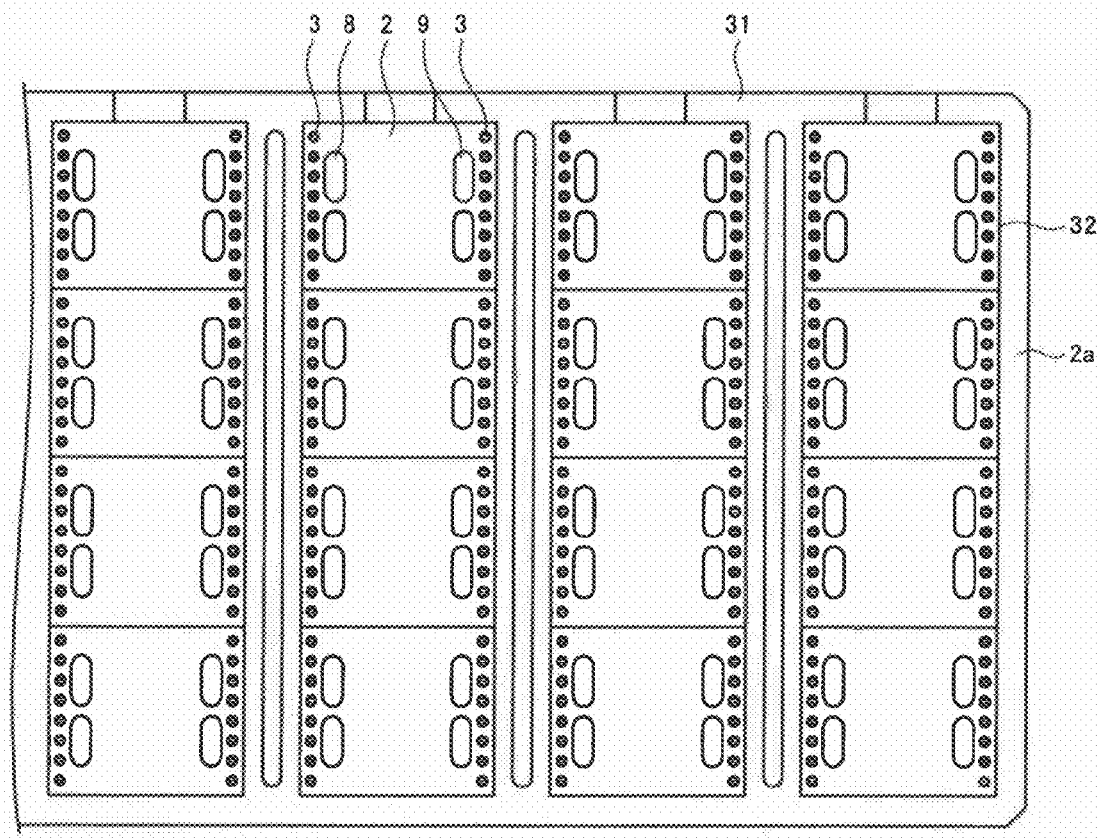
FIG. 4 is a plan view showing a substrate panel used in a manufacturing process of the semiconductor device.

For example, the semiconductor device 1 of the embodiment is manufactured as follows. A manufacturing process of the semiconductor device 1 is described with reference to FIG. 4 through FIG. 10. As shown in FIG. 4, the circuit boards 2 having the lands 3 (4) and the first and second openings 8, 9 is prepared. Here, the circuit boards 2 are supplied to the manufacturing process of the semiconductor device 1 as a substrate panel (circuit board panel) 31 having plural device-forming areas. FIG. 4 shows the first main surface 2a of the circuit board 2.

The substrate panel 31 has plural device-forming areas 32 each corresponding to one circuit board 2 (and the semiconductor device 1 using it). The used substrate panel 31 has the plural device-forming areas 32 of a triple structure sequentially arranged in a longitudinal direction. The connection pads 6, 7 are formed on both front and rear surfaces of the circuit board 2 though not shown in FIG. 4.

Then, a semiconductor element-mounting process and connecting process are performed as shown in FIG. 5 and FIG. 6. FIG. 5 and FIG. 6 show in a magnified form one of the circuit boards 2 (device-forming areas 32) on the substrate panel 31. The semiconductor element-mounting process and connecting process are described with reference to these drawings. In practice, the plural circuit boards 2 (device-forming areas 32) of the substrate panel 31 are sequentially subjected to the semiconductor element-mounting process and connecting process.

Figure 5A:
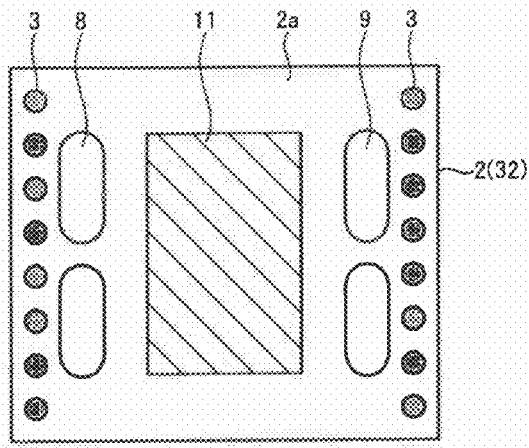
FIGS. 5A, 5B and 5C are views of a step of mounting semiconductor elements on a first main surface of a circuit board in the manufacturing process of the semiconductor device.
Figure 5B:
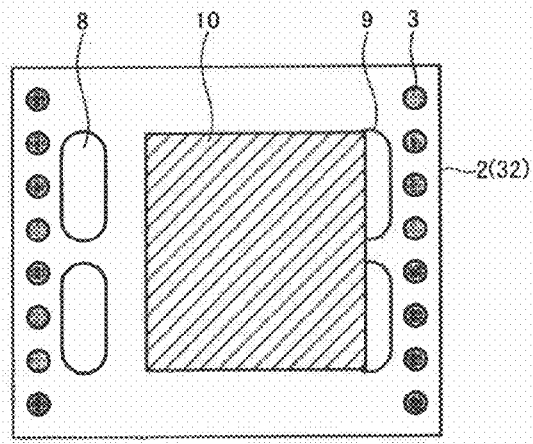
Figure 5C:
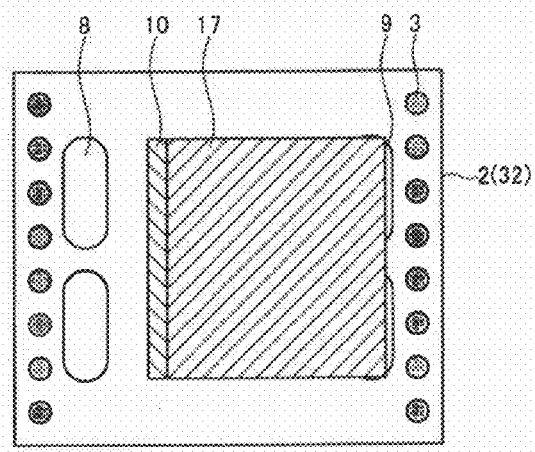

First, as shown in FIG. 5A, the adhesive layer 11 is formed about the center of the first main surface 2a of the circuit board 2 (device-forming area 32). The first semiconductor element 10 is adhered on the first main surface 2a of the circuit board 2 via the adhesive layer 11 as shown in FIG. 5B. Then, the third semiconductor element 17 is stacked on the first semiconductor element 10 as shown in FIG. 5C. The first and third semiconductor elements 10, 17 are stacked in a stepped shape with their directions aligned and the centers displaced. Besides, the first and third semiconductor elements 10, 17 are disposed to cover the second openings 9.

Figure 6A:
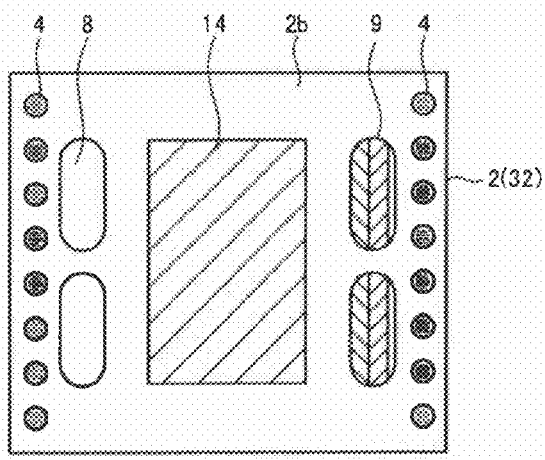
FIGS. 6A, 6B and 6C are views of a step of mounting semiconductor elements on a second main surface of a circuit board in the manufacturing process of the semiconductor device.
Figure 6B:
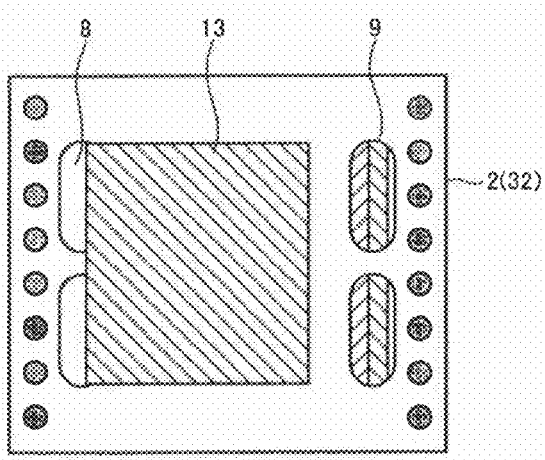
Figure 6C:
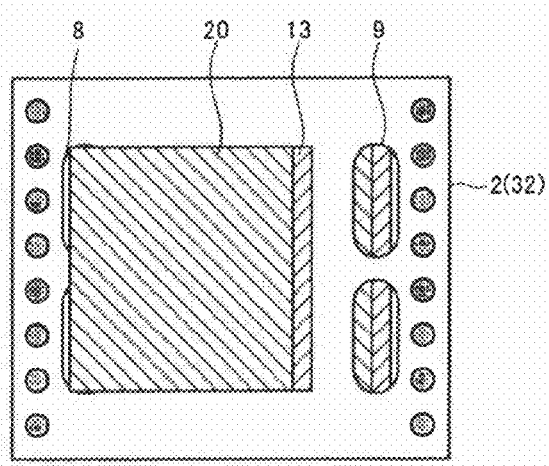

As shown in FIG. 6A, the adhesive layer 14 is formed about the center of the second main surface 2b of the circuit board 2 (device-forming area 32). The second semiconductor element 13 is adhered on the second main surface 2b of the circuit board 2 via the adhesive layer 14 as shown in FIG. 6B. Then, the fourth semiconductor element 20 is stacked on the second semiconductor element 13 as shown in FIG. 6C. The second and fourth semiconductor elements 13, 20 are stacked in a stepped shape with their directions aligned and the centers displaced. Besides, the second and fourth semiconductor elements 13, 20 are disposed to cover the first openings 8.

Figure 7A:
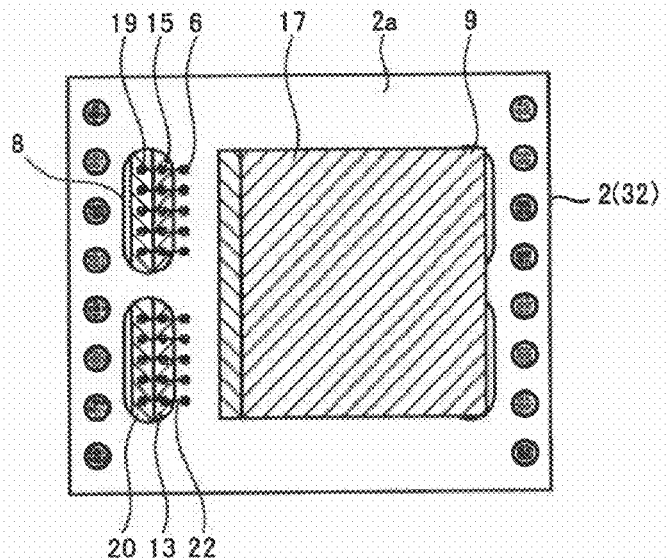
FIGS. 7A and 7B are views of a wire bonding step in the manufacturing process of the semiconductor device.

Then, as shown in FIG. 7A, the wire bonding process is performed upon the second and fourth semiconductor elements 13, 20 which are mounted on the second main surface 2b of the circuit board 2 from the first main surface 2a side of the circuit board 2 through the first openings 8. In other words, the first connection pads 6 formed on the first main surface 2a of the circuit board 2 and the electrode pads 15, 19 of the second and fourth semiconductor elements 13, 20 mounted on the second main surface 2b of the circuit board 2 are electrically connected via the first metal wires (bonding wires) 22 formed of Au wires or the like.

Figure 7B:
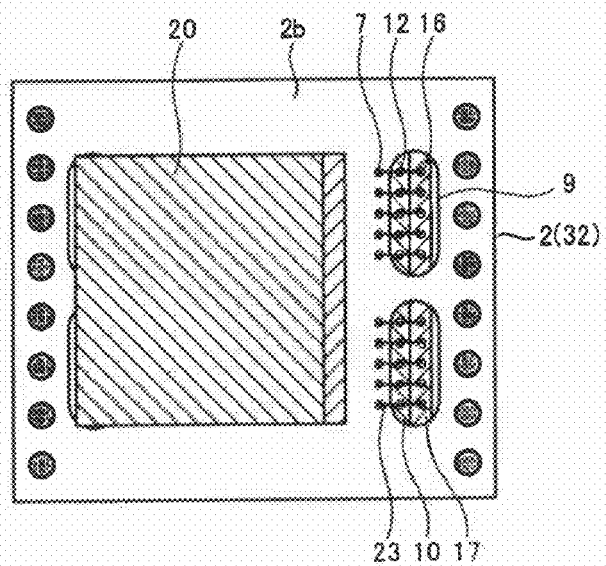

The circuit board 2 is then turned upside down as shown in FIG. 7B, the wire bonding process is performed upon the first and third semiconductor elements 10, 17 mounted on the first main surface 2a from the second main surface 2b side of the circuit board 2 through the second openings 9. The second connection pads 7 disposed on the second main surface 2b of the circuit board 2 and the electrode pads 12, 16 of the first and third semiconductor elements 10, 17 mounted on the first main surface 2a of the circuit board 2 are electrically connected via the second metal wires (bonding wires) 23 formed of Au wires or the like.

Figure 8:
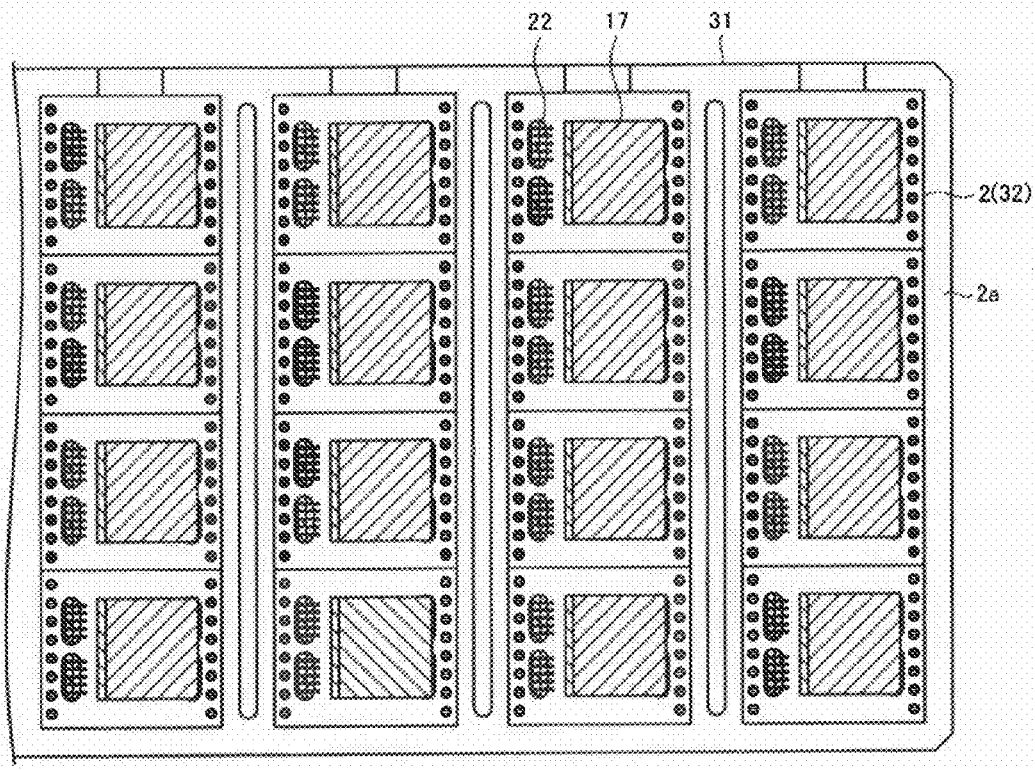
FIG. 8 is a plan view showing semiconductor elements mounted in device-forming areas of the substrate panel in the manufacturing process of the semiconductor device.

FIG. 8 shows a state that the plural semiconductor elements (10, 13, 17, 20) are mounted on the device-forming areas 32 (the circuit boards 2) of the substrate panel 31 by performing the individual steps shown in FIG. 5A through FIG. 5C, FIG. 6A through FIG. 6C and FIG. 7A and FIG. 7B. In FIG. 8, the semiconductor elements (10, 13, 17, 20) mounted on the individual device-forming areas 32 are electrically connected to the circuit board 2 via the metal wires (22, 23).

Figure 9:
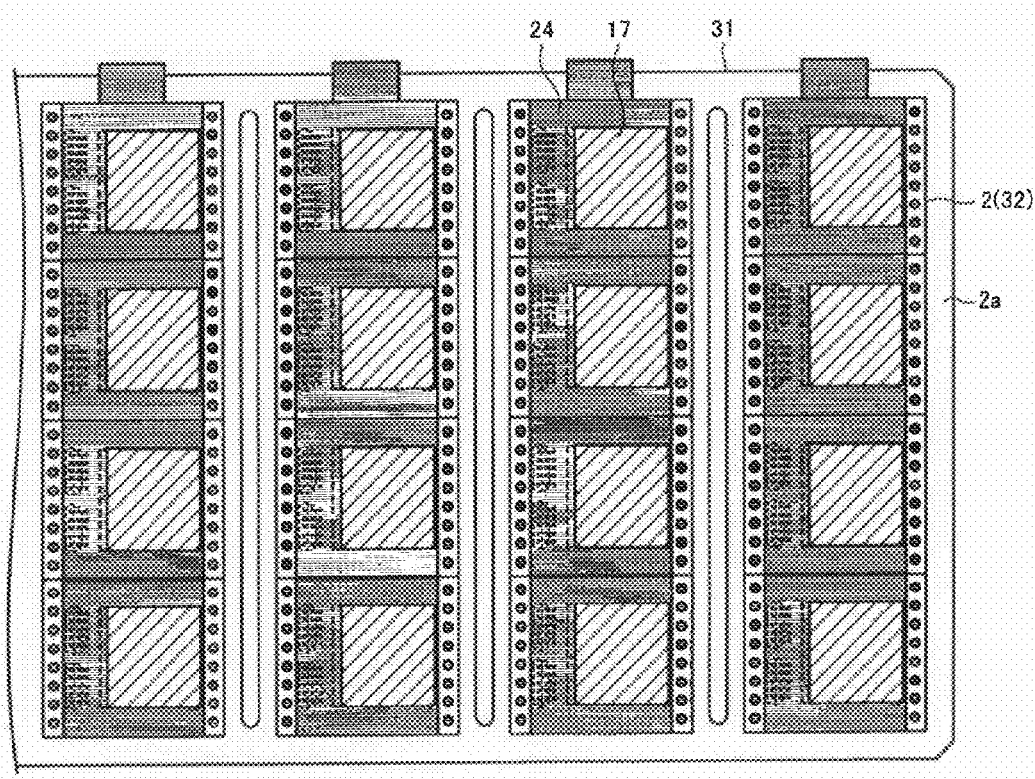
FIG. 9 is a plan view showing the device-forming areas of the substrate panel sealed with a resin in the manufacturing process of the semiconductor device.

Then, for example, injection molding of the sealing resin 24 is performed for collective resin molding of the both front and rear surfaces 2a, 2b of the circuit board 2 as shown in FIG. 9. The both front and rear surfaces of the device-forming area 32 of the triple structure are collectively subjected to the injection molding. It is desirable from the viewpoint of the thickness of the semiconductor device 1 that the sealing resin 24 is formed to expose the back surfaces of the semiconductor elements 17, 20 of the outermost layer. But, it is also effective to cover the back surfaces of the semiconductor elements 17, 20 of the outermost layer with the sealing resin 24 in order to enhance the reliability of the semiconductor device 1.

Figure 10:
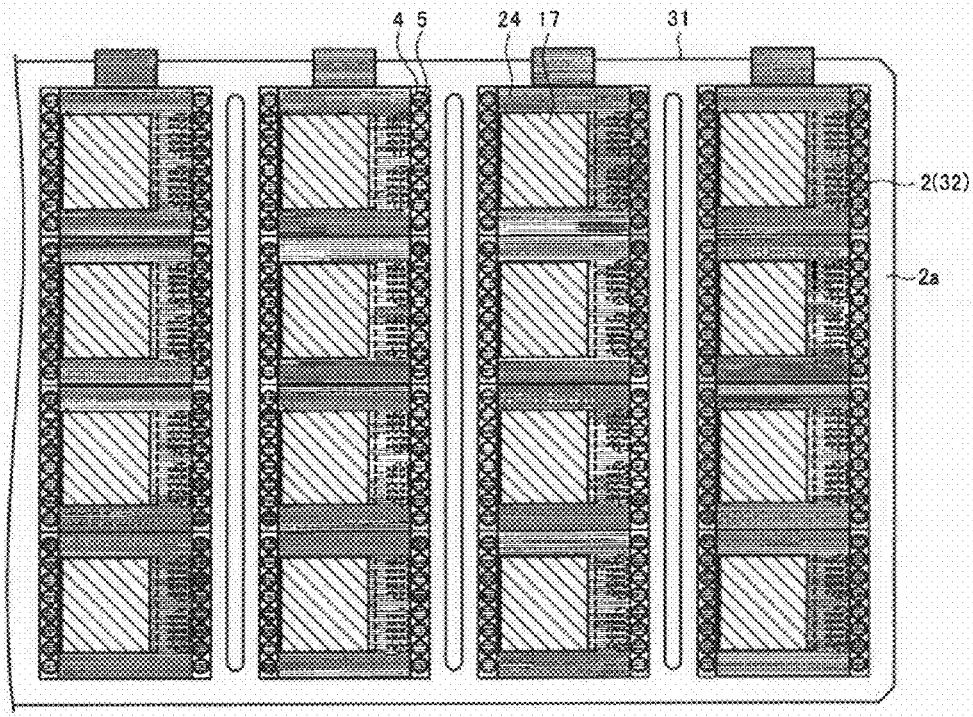
FIG. 10 is a plan view showing external connection terminals formed in the device-forming areas of the substrate panel in the manufacturing process of the semiconductor device.

Subsequently, solder balls are adhered as the external connection terminals 5 onto the lands 4 which are formed on the second main surface (back surface) 2b side of the circuit board 2 as shown in FIG. 10. And, the substrate panel 31, which has been undergone the mounting process of the semiconductor elements 10, 13, 17, 20, the connecting process by the metal wires 22, 23, the sealing process with the sealing resin 24 and the forming process of the external connection terminals 5, is cut off along the individual device-forming areas 32 to manufacture the individual semiconductor devices 10.

The semiconductor device 1 of the embodiment described above can be used directly as the semiconductor package. In such a case, when it is determined that the circuit board 2 has a thickness of 100 μm, the individual semiconductor elements 10, 13, 17, 20 have a thickness of 60 μm and the individual adhesive layers 11, 14, 18, 21 have a thickness of 10 μm, the sealing resin 24 can be determined to have a thickness of 380 μm corresponding to the stack thickness of the individual component elements. Even if the mounting height (e.g., 320 μm) of the external connection terminals 5 is taken into consideration, the semiconductor device 1 can be determined to have an overall height of about 500 μm.

Figure 11:
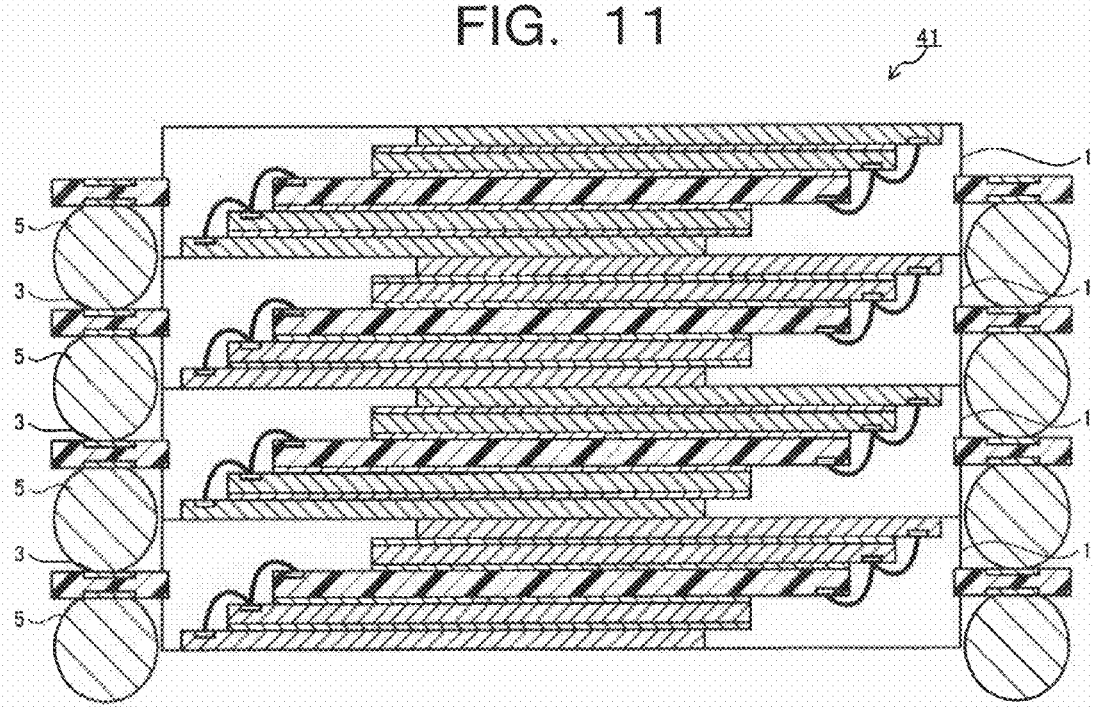
FIG. 11 is a sectional view showing a semiconductor module according to an embodiment.

The semiconductor device 1 is independently used as the semiconductor package and also used as a semiconductor module by multiple stacked structure. FIG. 11 shows a semiconductor module 41 having a structure (POP structure) that plural semiconductor devices 1 are stacked. FIG. 11 shows a state that the four semiconductor devices 1 are stacked. The plural semiconductor devices 1 are electrically connected by sequentially connecting the lands 3 formed on the first main surface 2a of the circuit board 2 and the external connection terminals 5 formed on the second main surface 2b. In other words, the lands 3 of the semiconductor device 1 located at a lower level and the external connection terminals 5 of the semiconductor device 1 located at an upper level are sequentially connected.

Figure 12:
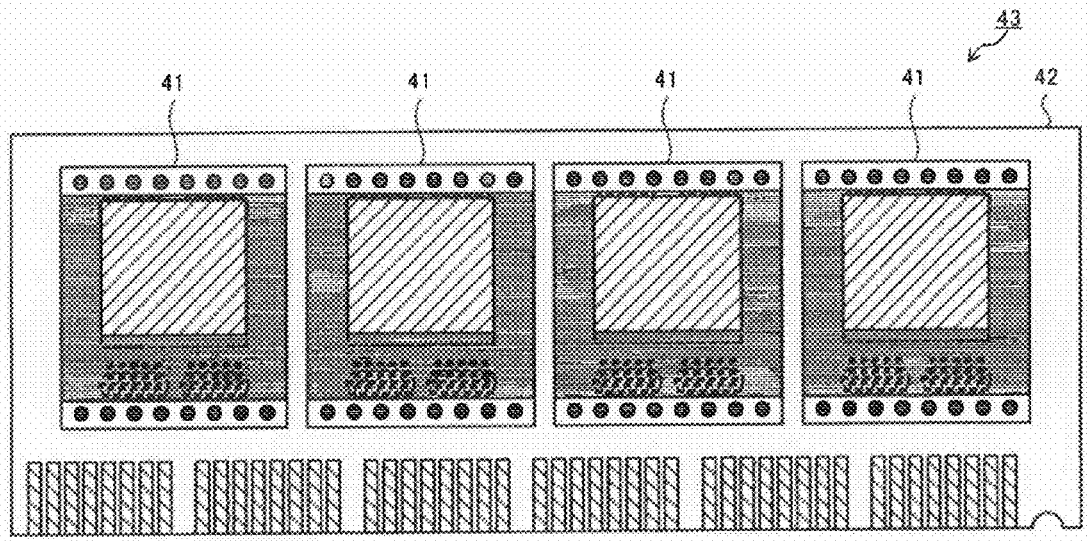
FIG. 12 is a plan view showing a module structure having the plural semiconductor modules mounted on a front and rear surfaces of a mounting board.
Figure 13:
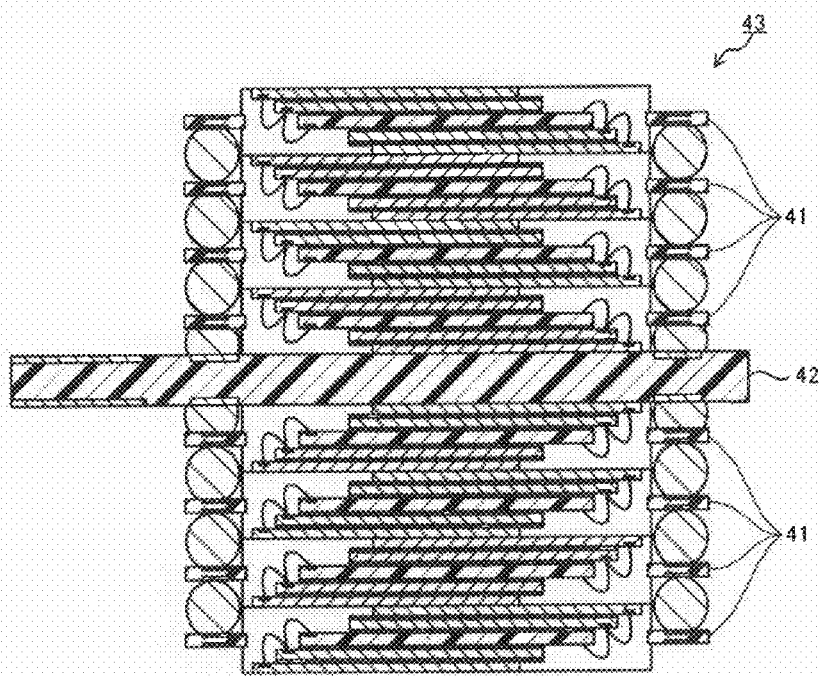
FIG. 13 is a sectional view of the module structure shown in FIG. 12.

FIG. 12 and FIG. 13 show a semiconductor module 43 which has the semiconductor module 41 of a four-stage structure mounted in a four consecutive state on both front and rear surfaces of a mounting board 42. In other words, four semiconductor modules 41, which have the semiconductor devices 1 stacked in a four-stage structure, are mounted on the front surface of the mounting board 42. Similarly, four semiconductor modules 41 are mounted on the back surface of the mounting board 42. Thus, eight semiconductor modules 41 are mounted on the mounting board 42, and a total of the semiconductor devices 1 becomes 32. Thus, the semiconductor modules may have a structure that the semiconductor devices 1 are mounted in multiple layers and multiple sequential numbers.

The semiconductor modules 41, 43 can be made thin by the thinning and reduction in connection height of the semiconductor devices 1. In the semiconductor module 41 shown in FIG. 11, when the semiconductor device 1 having the sealing resin 24 with a thickness of 380 μm and an overall height of 500 μm is stacked into four layers, the height (module height) can be made to be about 1.7 mm. The semiconductor modules 41, 43 are not limited to the structure that the plural semiconductor devices 1 having a NAND-type flash memory are stacked. To the semiconductor module can be applied various types such as a structure that a semiconductor device having logic elements mounted and a semiconductor device having a NAND-type flash memory mounted are stacked, a structure that semiconductor devices, which have a DRAM additionally mounted, are stacked, and the like.

It is to be noted that the present invention is not limited to the above-described embodiments but can be applied to the semiconductor devices having various types of structures that semiconductor elements are mounted on both surfaces of a circuit board and the circuit board and the semiconductor elements are connected. Such semiconductor devices are also included in the present invention. Various modifications and variations of the embodiments of the invention may be made within the technical scope of the present invention. And the modified or altered embodiments are also included in the technical scope of the present invention.

What is claimed is:

1. A semiconductor device, comprising:
   a circuit board which is provided with a first main surface having first connection pads, and a second main surface, located on an opposite side of the first main surface, having second connection pads;
   a first semiconductor element having a first circuit forming surface and first electrode pads disposed on the first circuit forming surface, the first semiconductor element being mounted on the first main surface of the circuit board to face the first circuit forming surface toward the first main surface of the circuit board;
   a second semiconductor element having a second circuit forming surface and second electrode pads disposed on the second circuit forming surface, the second semiconductor element being mounted on the second main surface of the circuit board to face the second circuit forming surface toward the second main surface of the circuit board;
   first metal wires electrically connecting the first connection pads of the circuit board and the second electrode pads of the second semiconductor element;
   second metal wires electrically connecting the second connection pads of the circuit board and the first electrode pads of the first semiconductor element; and
   a sealing portion which seals the first and second semiconductor elements together with the first and second metal wire.

2. The semiconductor device according to claim 1, wherein the circuit board has external connection terminals which are formed in an area excepting the area of the second main surface sealed with the sealing portion.

3. The semiconductor device according to claim 1, wherein the first connection pads are formed between a first outline side of the circuit board and a mounting area of the first semiconductor element on the first main surface of the circuit board, and the second connection pads are formed between a second outline side of the circuit board opposed to the first outline side and a mounting area of the second semiconductor element on the second main surface of the circuit board.

4. The semiconductor device according to claim 1, further comprising a third semiconductor element having a third circuit forming surface and third electrode pads disposed on the third circuit forming surface,
wherein the third semiconductor element is stacked on a first back surface of the first semiconductor element opposed to the first circuit forming surface to face the third circuit forming surface toward the first main surface of the circuit board, and the third electrode pads of the third semiconductor element are electrically connected to the second connection pads of the circuit board.

5. The semiconductor device according to claim 4, wherein the second connection pad, the first electrode pad and the third electrode pad are electrically connected sequentially by the second metal wire.

6. The semiconductor device according to claim 1, further comprising a fourth semiconductor element having a fourth circuit forming surface and fourth electrode pads disposed on the first circuit forming surface,
wherein the fourth semiconductor element is stacked on a second back surface of the second semiconductor element opposed to the second circuit forming surface to face the fourth circuit forming surface toward the second main surface of the circuit board, and the fourth electrode pads of the fourth semiconductor element are electrically connected to the first connection pads of the circuit board.

7. The semiconductor device according to claim 6, wherein the first connection pad, the second electrode pad and the fourth electrode pad are electrically connected sequentially by the first metal wire.

8. The semiconductor device according to claim 1, wherein the circuit board has a first opening formed near the first connection pads to pass through the circuit board, and a second opening formed near the second connection pads to pass through the circuit board;
wherein the first electrode pads of the first semiconductor element are exposed through the second opening, and the second electrode pads of the second semiconductor element are exposed through the first opening; and
wherein the first metal wires are disposed through the first opening, and the second metal wires are disposed through the second opening.

9. The semiconductor device according to claim 2, wherein the circuit board has a wiring network which electrically connects the external connection terminals and the first and second connection pads.

10. A semiconductor device, comprising:
a circuit board which is provided with a first main surface having first connection pads, and a second main surface, located on a opposite side of the first main surface, having second connection pads;
a first element group which includes a plurality of first semiconductor elements having first circuit forming surfaces and first electrode pads disposed on the first circuit forming surfaces, the first semiconductor elements being stacked in a stepped shape on the first main surface of the circuit board to face the first circuit forming surfaces toward the first main surface of the circuit board;
a second element group which includes a plurality of second semiconductor elements having second circuit forming surfaces and second electrode pads disposed on the second circuit forming surfaces, the second semiconductor elements being stacked in a stepped shape on the second main surface of the circuit board to face the second circuit forming surfaces toward the second main surface of the circuit board;
first metal wires electrically connecting the first connection pads of the circuit board and the second electrode pads of the second semiconductor elements configuring the second element group;
second metal wires electrically connecting the second connection pads of the circuit board and the first electrode pads of the first semiconductor elements configuring the first element group; and
a sealing portion which seals the first and second element groups together with the first and second metal wires.

11. The semiconductor device according to claim 10, wherein the circuit board includes external connection terminals which are formed in an area excepting the area of the second main surface sealed with the sealing portion.

12. The semiconductor device according to claim 10, wherein the sealing portion is formed to expose back surfaces of the semiconductor elements located on uppermost portions among the plurality of semiconductor elements configuring the first and second element groups.

13. The semiconductor device according to claim 10, wherein the circuit board has a first opening formed near the first connection pads to pass through the circuit board, and a second opening formed near the second connection pads to pass through the circuit board;
wherein the first electrode pads of the first semiconductor elements are exposed through the second opening, and the second electrode pads of the second semiconductor elements are exposed through the first opening; and
wherein the first metal wires are disposed through the first opening, and the second metal wires are disposed through the second opening.

14. The semiconductor device according to claim 11, wherein the circuit board has a wiring network which electrically connects the external connection terminals and the first and second connection pads.

15. A semiconductor module, comprising:
first and second devices each including the semiconductor device comprising,
a circuit board which is provided with a first main surface having first connection pads, and a second main surface, located on an opposite side of the first main surface, having second connection pads;
a first semiconductor element having a first circuit forming surface and first electrode pads disposed on the first circuit forming surface, the first semiconductor element being mounted on the first main surface of the circuit board to face the first circuit forming surface toward the first main surface of the circuit board;
a second semiconductor element having a second circuit forming surface and second electrode pads disposed on the second circuit forming surface, the second semiconductor element being mounted on the second main surface of the circuit board to face the second circuit forming surface toward the second main surface of the circuit board;
first metal wires electrically connecting the first connection pads of the circuit board and the second electrode pads of the second semiconductor element;
second metal wires electrically connecting the second connection pads of the circuit board and the first electrode pads of the first semiconductor element; and a sealing portion which seals the first and second semiconductor elements together with the first and second metal wire; and the second device stacked on the first device.

16. The semiconductor module according to claim 15, wherein the circuit board of the semiconductor device configuring the first device and the circuit board of the semiconductor device configuring the second device include first lands which are formed in areas excepting the areas of the first main surfaces sealed by the sealing portions, second lands which are formed in areas excepting the areas of the second main surfaces sealed by the sealing portions, and external connection terminals which are disposed on the second lands; and wherein the first land of the first device is electrically connected with the external connection terminal of the second device.

17. The semiconductor module according to claim 15, wherein the semiconductor device is provided with a third semiconductor element having a third circuit forming surface and third electrode pads disposed on the third circuit forming surface, the third semiconductor element is stacked on the first semiconductor element to face the third circuit forming surface toward the first main surface of the circuit board, and the third electrode pads of the third semiconductor element are electrically connected to the second connection pads of the circuit board.

18. The semiconductor module according to claim 17, wherein the second connection pad, the first electrode pad and the third electrode pad are electrically connected sequentially by the second metal wire.

19. The semiconductor module according to claim 15, wherein the semiconductor device is provided with a fourth semiconductor element having a fourth circuit forming surface and fourth electrode pads disposed on the fourth circuit forming surface, the fourth semiconductor element is stacked on the second semiconductor element to face the fourth circuit forming surface toward the second main surface of the circuit board, and the fourth electrode pads of the fourth semiconductor element are electrically connected to the first connection pads of the circuit board.

20. The semiconductor module according to claim 19, wherein the first connection pad, the second electrode pad and the fourth electrode pad are electrically connected sequentially by the first connection member metal wire.

* * * * *